(12) United States Patent
Zhao et al.

(10) Patent No.: US 11,858,809 B2
(45) Date of Patent: Jan. 2, 2024

(54) METHOD FOR INFLATING MICRO-CHANNELS

(71) Applicant: TAIYUAN UNIVERSITY OF TECHNOLOGY, Shanxi (CN)

(72) Inventors: Jingwei Zhao, Shanxi (CN); Tao Wang, Shanxi (CN); Linan Ma, Shanxi (CN); Qingxue Huang, Shanxi (CN)

(73) Assignee: TAIYUAN UNIVERSITY OF TECHNOLOGY, Shanxi (CN)

( * ) Notice: Subject to any disclaimer, the term of this patent is extended or adjusted under 35 U.S.C. 154(b) by 426 days.

(21) Appl. No.: 17/339,886

(22) Filed: Jun. 4, 2021

(65) Prior Publication Data

US 2021/0292159 A1 Sep. 23, 2021

Related U.S. Application Data

(63) Continuation of application No. PCT/CN2020/081910, filed on Mar. 28, 2020.

(30) Foreign Application Priority Data

Mar. 13, 2020 (CN) .......................... 202010177003.8

(51) Int. Cl.
*B81C 1/00* (2006.01)
*B23K 11/11* (2006.01)
*B08B 7/02* (2006.01)

(52) U.S. Cl.
CPC .......... *B81C 1/00071* (2013.01); *B08B 7/028* (2013.01); *B23K 11/11* (2013.01); *B23P 2700/12* (2013.01); *B81C 2201/0102* (2013.01); *B81C 2201/013* (2013.01); *B81C 2900/00* (2013.01); *Y10T 29/301* (2015.01); *Y10T 29/303* (2015.01); *Y10T 29/49771* (2015.01)

(58) Field of Classification Search
CPC ................. Y10T 29/301; Y10T 29/303; Y10T 29/49771; B23P 2700/12; B81C 1/0071; B81C 2201/0102; B81C 2201/03
See application file for complete search history.

(56) References Cited

U.S. PATENT DOCUMENTS

| | | | |
|---|---|---|---|
| 2,969,299 A * | 1/1961 | Fullerton | C21D 1/773 148/578 |
| 2002/0046995 A1* | 4/2002 | Chang | B81C 1/00071 219/121.69 |

* cited by examiner

*Primary Examiner* — Jermie E Cozart

(57) ABSTRACT

The invention belongs to the technical field of metal micro-forming, and in particular relates to a method for inflating micro-channels. The present invention is aimed at the problems of low process flexibility, single product type, and non-closed structure of the micro-channel when preparing metal micro-channels by micro-plastic forming of ultra-thin metal strips. The present invention uses a method combining numerical simulation and bond rolling experiment to analyze the effect of the hydrogen pressure and bond strength of the metal composite ultra-thin strip after bond rolling on the pore diameter of the micro-channel, and the corresponding relationship between the micro-channel pore diameter and the titanium hydride content, heating temperature, and bond strength of the metal composite ultra-thin strip is obtained.

6 Claims, 2 Drawing Sheets

METHOD FOR INFLATING MICRO-CHANNELS

CROSS REFERENCE OF RELATED APPLICATION

This is a Continuation application of an International Application PCT/CN2020/081910, filed Mar. 28, 2020, which claims priority under 35 U.S.C. 119(a-d) to CN 202010177003.8, filed Mar. 13, 2020.

BACKGROUND OF THE PRESENT INVENTION

Field of Invention

The present invention belongs to the technical field of metal micro-forming, and more particular to a method for inflating micro-channels.

Description of Related Arts

Metal micro-channels, which belong to the core structural components of micro-devices such as micro-reactors, micro-heat exchangers, and micro-radiators, are an important part of micro-electromechanical systems and micro-fluid systems and have wide range of applications in the fields of biology, medicine, chemistry, electronics, and mechanical engineering. At present, the more common metal micro-channel forming and preparation methods include: machining, lithography, laser-assisted processing, die-casting, photolithography, electroforming, injection molding, chemical etching, etc. However, the process is generally complicated, and it is difficult to realize multi-specification and multi-structure metal mass production of micro-channels. The ultra-thin metal strip micro-plastic forming technology has the advantages of low cost, high efficiency, and mass production, and is widely used in the preparation of metal micro-channels. However, due to the limitations of forming molds, process methods, raw materials, etc., most of the micro-channel products prepared by the ultra-thin metal strip micro-plastic forming technology have a non-closed groove structure, which has low process flexibility and a single product category. In practical applications, it is necessary to install cover plates on the upper and lower surfaces of the non-closed micro-channels to make the channels into closed tubes, and then they can be used in micro-reactors, micro-radiators and other equipment that need to carry liquid and gas flow, which increases the complexity of the process and production costs.

SUMMARY OF THE PRESENT INVENTION

Aiming at the problems of low process flexibility, single product type, and non-closed structure of the micro-channel when preparing metal micro-channels by micro-plastic forming of ultra-thin metal strips, the present invention provides a closed tubular inflatable forming method for micro-channels. In order to solve the above technical problems, the technical solutions adopted by the present invention are as follows:

A method for inflating a micro-channel, comprising following steps of:

Step (1) determining a quantitative relationship among titanium hydride content-temperature-hydrogen pressure and a relationship between a target pore size of the micro-channel and an amount of hydrogen released from decomposition of titanium hydride and a heating temperature;

Step (2) engraving micro/nano grooves on a surface of an ultra-thin metal strip by a micro/nano scratcher, and performing surface cleaning treatment;

Step (3) determining an amount of titanium hydride according to the quantitative relationship among titanium hydride content-temperature-hydrogen pressure and the relationship between the target pore size of the micro-channel and the amount of hydrogen released from decomposition of titanium hydride and the heating temperature determined in step (1), and the titanium hydride powder is placed in the micro/nano groove of the metal strip after the surface cleaning treatment in step (2);

Step (4) covering another ultra-thin metal strip with identical size and identical surface cleaning treatment in step (2) on the ultra-thin metal strip in step (3), welding the edges of the two ultra-thin metal strips together by spot welding technology, and performing bond rolling;

Step (5) heating the metal composite ultra-thin strip after bond rolling in step (4) under vacuum conditions, and keeping temperature to decompose the titanium hydride to release hydrogen, and by hydrogen pressure, plastic deformation occurs at the composite interface of the bond-rolled metal composite ultra-thin strip, and a tubular micro-channel structure is formed along the micro/nano groove engraved in step (2);

Step (6) cutting the tubular micro-channel structure generated in step (5) at an appropriate position to obtain a tubular micro-channel product. By adopting steps (1)-(5) of technical solution, specifying a relationship between the target pore size of the micro-channel and the amount of titanium hydride and the heating temperature, and further understanding the effects of processing parameters on inflating micro-forming, obtaining controlling strategies of the pore size of the micro-channel.

Preferably, a specific process of determining the quantitative relationship among titanium hydride content-temperature-hydrogen pressure and the relationship between the target pore size of the micro-channel and the amount of hydrogen released from decomposition of titanium hydride and the heating temperature in the step (1) comprises: calculating an equilibrium hydrogen pressure when titanium hydride decomposes by thermodynamic method; analyzing the decomposition behavior of titanium hydride in the actual heating process by differential scanning calorimeter and thermal weight loss analyzer, so as to obtain the heating temperature to decompose and release hydrogen to determine the quantitative relationship between titanium hydride content-temperature-hydrogen pressure; by the method of combining numerical simulation and bond rolling experiment, analyzing the effect of the hydrogen pressure and bond strength of the metal composite ultra-thin strip after bond rolling on the pore size of the micro-channel, and the corresponding relationship between the pore size of the micro-channel and the content of titanium hydride, the heating temperature, and the bond strength of the metal composite ultra-thin strip is obtained.

Preferably, the surface cleaning treatment in step (2) is immersing the ultra-thin metal strips engraved with micro/nano grooves in an acetone solution, cleaning the ultra-thin strip by ultrasonic cleaner to remove the scratch residue on its surface, to ensure that the composite interface is clean during the rolling process, and to improve the bond rolling effect of the ultra-thin metal strip.

Preferably, a heating temperature in the step (5) is at a range of 500-700° C., and a keeping time is at a range of 10-30 min. By heating the titanium hydride to decomposition temperature and keeping temperature for a certain period of time, promoting fully decomposition of titanium hydride and generating sufficient hydrogen pressure for inflating micro-channel forming.

Preferably, the titanium hydride in step (1) can be replaced by zirconium hydride or other metal hydrides.

Preferably, a thickness of the ultra-thin metal strip in the steps (1)-(5) is at a range of 20~200 μm.

Preferably, the material of the metal ultra-thin strip is one member selected from stainless steel, pure metal of titanium, copper, and aluminum; or an alloy of titanium, copper, and aluminum; wherein two ultra-thin metal strips have the identical material or a combination of different materials during bond rolling.

Compared with the conventional art, the beneficial effects of the present invention are:

The invention has no special mold requirements, a wide selection range of metal materials, and low equipment capabilities. It can prepare closed tubular micro-channel products with different pore diameters and different distributions according to requirements. The product types are abundant and the process flexibility is high.

DETAILED DESCRIPTION OF THE PREFERRED EMBODIMENT

The following describes the technical solutions in the embodiments of the present invention clearly and completely with reference to the accompanying drawings in the embodiments of the present invention. Obviously, the described embodiments are only a part of the embodiments of the present invention, rather than all the embodiments.

EMBODIMENT

Referring to FIGS. 1-4, a method for inflating a micro-channel, comprising following steps of:

Step (1) calculating an equilibrium hydrogen pressure when titanium hydride decomposes by thermodynamic method; analyzing the decomposition behavior of titanium hydride in the actual heating process by differential scanning calorimeter and thermal weight loss analyzer, so as to obtain the heating temperature to decompose and release hydrogen to determine the quantitative relationship between titanium hydride content-temperature-hydrogen pressure; by the method of combining numerical simulation and bond rolling experiment, analyzing the effect of the hydrogen pressure and bond strength of the metal composite ultra-thin strip after bond rolling on the pore size of the micro-channel, and the corresponding relationship between the pore size of the micro-channel and the content of titanium hydride, the heating temperature, and the bond strength of the metal composite ultra-thin strip is obtained.

Step (2) engraving micro/nano grooves on a surface of a thin metal strip by a micro/nano scratcher, immersing the ultra-thin strip with micro/nano grooves in the acetone solution, and cleaning the ultra-thin strip by ultrasonic cleaner to remove the scratch residue on its surface;

Step (3) determining an amount of titanium hydride according to the quantitative relationship among titanium hydride content-temperature-hydrogen pressure and the relationship between the target pore size of the micro-channel and the amount of hydrogen released from decomposition of titanium hydride and the heating temperature determined in step (1), and the titanium hydride powder is placed in the micro/nano groove of the metal strip after the surface cleaning treatment in step (2);

Step (4) covering another ultra-thin metal strip with identical size and identical surface cleaning treatment in step (2) on the ultra-thin metal strip in step (3), welding the edges of the two ultra-thin metal strips together by spot welding technology, and performing bond rolling;

Step (5) heating the metal composite ultra-thin strip after bond rolling in step (4) under vacuum conditions, and keeping temperature to decompose the titanium hydride to release hydrogen, and by hydrogen pressure, plastic deformation occurs at the composite interface of the bond-rolled metal composite ultra-thin strip, and a tubular micro-channel structure is formed along the micro/nano groove engraved in step (2);

Step (6) cutting the tubular micro-channel structure generated in step (5) at an appropriate position to obtain a tubular micro-channel product.

Figure 1:
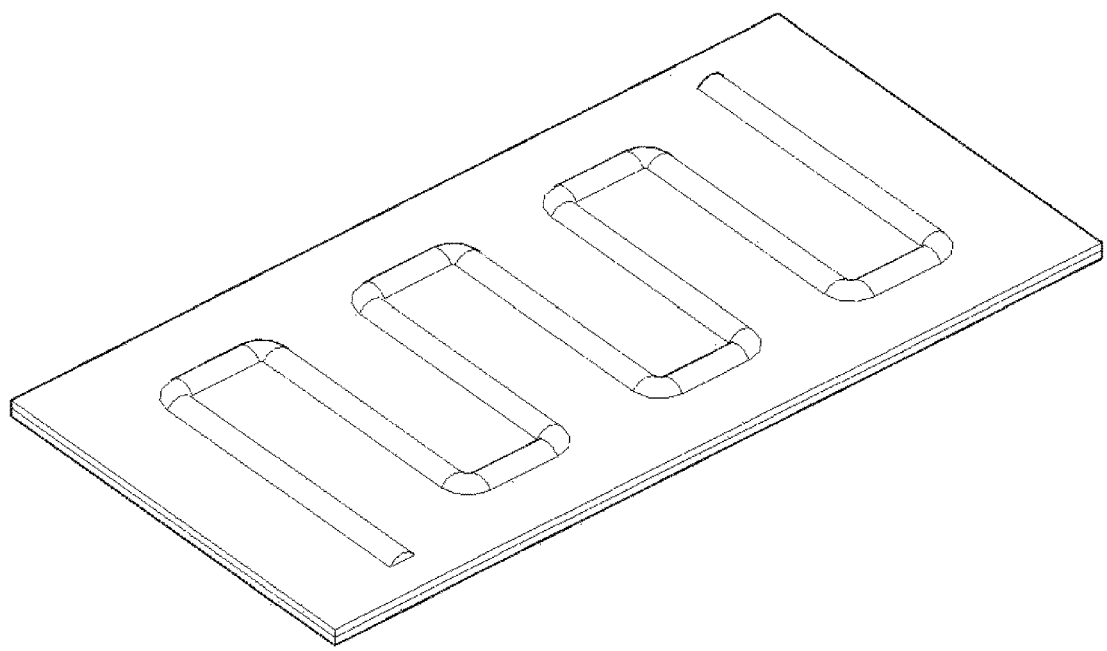
FIG. 1 is a schematic diagram of a single channel structure of the present invention.
Figure 2:
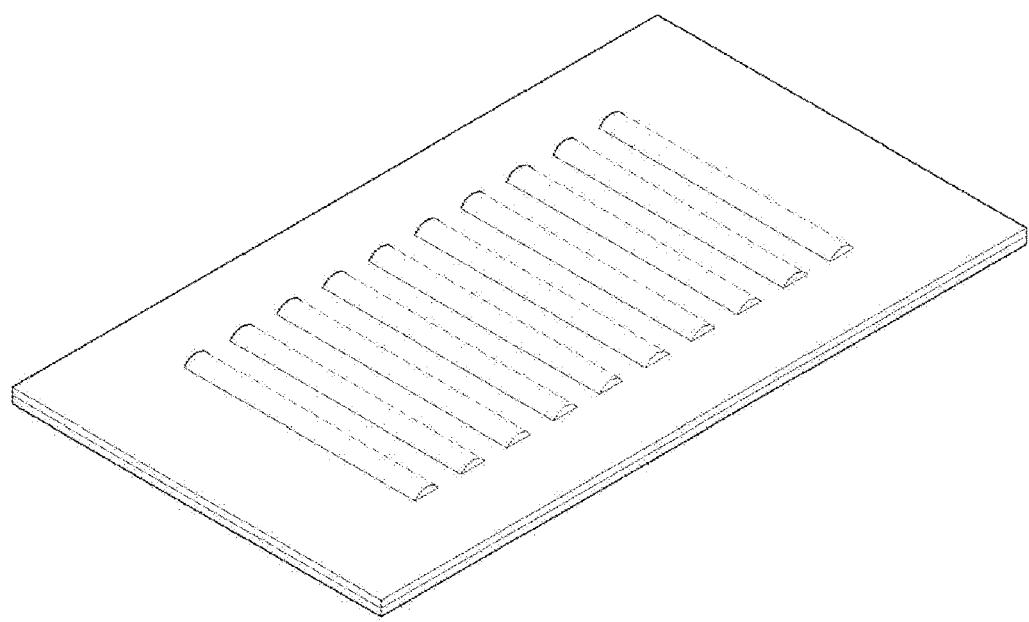
FIG. 2 is a schematic diagram of a multi-channel structure of the present invention.
Figure 3:
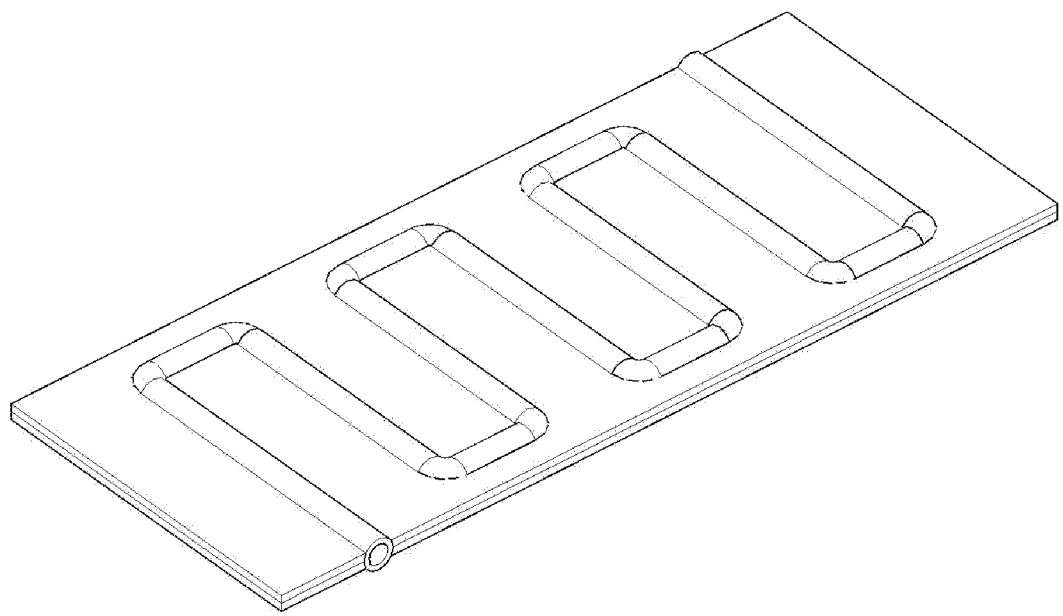
FIG. 3 is a schematic diagram of a micro-channel product of FIG. 1 of the present invention.
Figure 4:
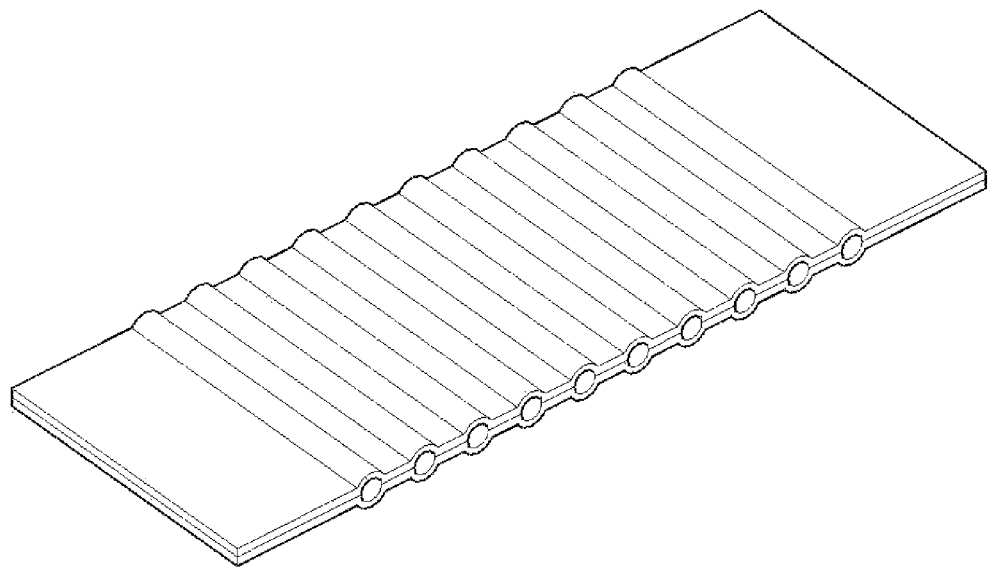
FIG. 4 is a schematic diagram of a micro-channel product of FIG. 2 of the present invention.

The single-channel structure shown in FIG. 1 and the multi-channel structure shown in FIG. 2 in this embodiment are only two special distributions of micro-channels. The number, direction, and distribution of the micro-channels involved in the present invention can be flexibly set according to requirements; all belong to the content protected by the present invention.

In the embodiment, the heating temperature in step (5) is at a range of 500-700° C., and the holding time is at a range of 10-30 min; the titanium hydride in step (1) can be replaced by zirconium hydride or other metal hydrides, and in the step (1)-(5), the thickness of the metal ultra-thin strip is at a range of 20-200 μm, such as 20 μm, 50 μm, 100 μm, 150 μm or 200 μm. The ultra-thin metal strip material is stainless steel, and pure metals such as titanium, copper and aluminum or an alloy of titanium, copper, and aluminum. The two ultra-thin metal strips have the same material during bond rolling, or a combination of dissimilar materials.

What is claimed is:

1. A method for inflating a micro-channel, comprising steps of:

Step (1) determining a quantitative relationship among titanium hydride content-temperature-hydrogen pressure and a relationship between a target pore size of the micro-channel and an amount of hydrogen released from decomposition of titanium hydride and a heating temperature;

Step (2) engraving micro/nano grooves on a surface of an ultra-thin metal strip by a micro/nano scratcher, and performing surface cleaning treatment;

Step (3) determining an amount of titanium hydride according to the quantitative relationship among titanium hydride content-temperature-hydrogen pressure and the relationship between the target pore size of the micro-channel and the amount of hydrogen released from decomposition of titanium hydride and the heating temperature determined in step (1), and the titanium hydride is placed in the micro/nano groove of the metal strip after the surface cleaning treatment in step (2);

Step (4) covering another ultra-thin metal strip with identical size and identical surface cleaning treatment in step (2) on the ultra-thin metal strip in step (3), welding the edges of the two ultra-thin metal strips together by spot welding technology, and performing bond rolling;

Step (5) heating the metal composite ultra-thin strip after bond rolling in step (4) under vacuum conditions, and keeping temperature to decompose the titanium hydride to release hydrogen, and by hydrogen pressure, plastic deformation occurs at the composite interface of the bond-rolled metal composite ultra-thin strip, and a tubular micro-channel structure is formed along the micro/nano groove engraved in step (2);

Step (6) cutting the tubular micro-channel structure generated in step (5) at an appropriate position to obtain a tubular micro-channel product;

wherein a specific process of determining the quantitative relationship among titanium hydride content-temperature-hydrogen pressure and the relationship between the target pore size of the micro-channel and the amount of hydrogen released from decomposition of titanium hydride and the heating temperature in the step (1) comprising: calculating an equilibrium hydrogen pressure when titanium hydride decomposes by thermodynamic method; analyzing the decomposition behavior of titanium hydride in the actual heating process by differential scanning calorimeter and thermal weight loss analyzer, so as to obtain the heating temperature to decompose and release hydrogen to determine the quantitative relationship between titanium hydride content-temperature-hydrogen pressure; by the method of combining numerical simulation and bond rolling experiment, analyzing the effect of the hydrogen pressure and bond strength of the metal composite ultra-thin strip after bond rolling on the pore size of the micro-channel, and the corresponding relationship between the pore size of the micro-channel and the content of titanium hydride, the heating temperature, and the bond strength of the metal composite ultra-thin strip is obtained.

2. The method for inflating the micro-channels according to claim 1, wherein the surface cleaning treatment in step (2) is immersing the ultra-thin metal strips engraved with micro/nano grooves in an acetone solution, cleaning the ultra-thin strip by ultrasonic cleaner to remove the scratch residue on its surface, to ensure that the composite interface is clean during the rolling process, and to improve the bond rolling effect of the ultra-thin metal strip.

3. The method for inflating the micro-channels according to claim 1, wherein a heating temperature in the step (5) is at a range of 500-700° C., and a keeping time is at a range of 10-30 min.

4. The method for inflating the micro-channels according to claim 1, wherein the titanium hydride in step (1) is capable of being replaced by zirconium hydride or other metal hydrides.

5. The method for inflating the micro-channels according to claim 1, wherein a thickness of the ultra-thin metal strip in the steps (1)-(5) is at a range of 20-200 μm.

6. The method for inflating the micro-channels according to claim 1, wherein the material of the metal ultra-thin strip is at least one member selected from the group consisting of stainless steel, pure metal of titanium, copper, and aluminum; or an alloy of titanium, copper, and aluminum; wherein two metal ultra-thin strips have the identical material or a combination of different materials during bond rolling.

* * * * *